United States Patent
Kondo

(10) Patent No.: US 7,695,760 B2
(45) Date of Patent: Apr. 13, 2010

(54) DEPOSITION METHOD FOR OXIDE THIN FILM OR STACKED METAL THIN FILMS USING SUPERCRITICAL FLUID OR SUBCRITICAL FLUID, AND DEPOSITION APPARATUS THEREFOR

(75) Inventor: Eiichi Kondo, Yamanashi (JP)

(73) Assignee: Yamanashi University, Kofu-Shi (JP)

( * ) Notice: Subject to any disclaimer, the term of this patent is extended or adjusted under 35 U.S.C. 154(b) by 511 days.

(21) Appl. No.: 11/628,327

(22) PCT Filed: Jun. 1, 2005

(86) PCT No.: PCT/JP2005/010040

§ 371 (c)(1),
(2), (4) Date: Apr. 13, 2007

(87) PCT Pub. No.: WO2005/118910

PCT Pub. Date: Dec. 15, 2005

(65) Prior Publication Data

US 2008/0107804 A1  May 8, 2008

(30) Foreign Application Priority Data

Jun. 4, 2004  (JP)  ............................. 2004-167782

(51) Int. Cl.
*B05D 5/12* (2006.01)
*B05C 11/02* (2006.01)

(52) U.S. Cl. ...................................... 427/123; 118/715

(58) Field of Classification Search .................. 118/715
See application file for complete search history.

(56) References Cited

U.S. PATENT DOCUMENTS 6,132,653 A   10/2000  Hunt et al.
2001/0039919 A1  11/2001  Hunt et al.

(Continued)

FOREIGN PATENT DOCUMENTS

JP   2000-357686 A   12/2000

(Continued)

OTHER PUBLICATIONS

Matson et al; Ind. Eng. Chem. RES., vol. 26, No. 11, 1987, pp. 2298-2306.

(Continued)

*Primary Examiner*—Shamim Ahmed
(74) *Attorney, Agent, or Firm*—Birch, Stewart, Kolasch & Birch, LLP

(57) ABSTRACT

What is provided is a method and an apparatus for easily forming a multilayer structure of conductive metal thin films while forming a metal oxide thin film regardless of the conductivity of a substrate. A thin film of conductive metal is laminated by: dissolving metal precursors for a metal oxide to be formed and an oxidant to oxidize the metal precursors in a supercritical fluid or subcritical fluid; forming a metal oxide thin film by an oxidation reaction on the surface of a substrate in the supercritical fluid or subcritical fluid; then, dissolving a reducing agent and conductive metal precursors in a supercritical fluid or subcritical fluid; while reducing the metal oxide thin film formed on the surface of the substrate to a metal thin film, reducing the conductive metal precursors on the reduced metal thin film.

23 Claims, 6 Drawing Sheets

U.S. PATENT DOCUMENTS

| | | |
|---|---|---|
| 2002/0015797 A1 | 2/2002 | Hunt et al. |
| 2002/0083959 A1 | 7/2002 | Morita et al. |
| 2003/0003604 A1 | 1/2003 | Morita et al. |
| 2003/0003770 A1 | 1/2003 | Morita et al. |
| 2003/0020157 A1 | 1/2003 | Natori et al. |
| 2003/0021079 A1 | 1/2003 | Natori et al. |
| 2003/0161954 A1* | 8/2003 | Blackburn et al. .......... 427/337 |
| 2004/0023453 A1* | 2/2004 | Xu et al. ..................... 438/202 |
| 2004/0033318 A1 | 2/2004 | Kijima et al. |
| 2004/0084773 A1* | 5/2004 | Johnston et al. ............. 257/751 |
| 2004/0229023 A1 | 11/2004 | Watkins et al. |
| 2005/0019551 A1 | 1/2005 | Hunt et al. |
| 2005/0260846 A1 | 11/2005 | Kondoh et al. |
| 2006/0154482 A1 | 7/2006 | Kondoh et al. |

FOREIGN PATENT DOCUMENTS

| | | |
|---|---|---|
| JP | 2003-514115 A | 4/2003 |
| JP | 2003-213425 A | 7/2003 |
| JP | 2004-225152 A | 8/2004 |
| JP | 2004-228526 A | 8/2004 |
| WO | WO-97/05994 A1 | 2/1997 |
| WO | WO-01/32951 A2 | 5/2001 |
| WO | WO-02-102712 A1 | 12/2002 |
| WO | WO-02/102712 A1 | 12/2002 |

OTHER PUBLICATIONS

Kondoh et al., Microelectronic Engineering, vol. 64, (2002) pp. 495-499.

* cited by examiner

FIG.3
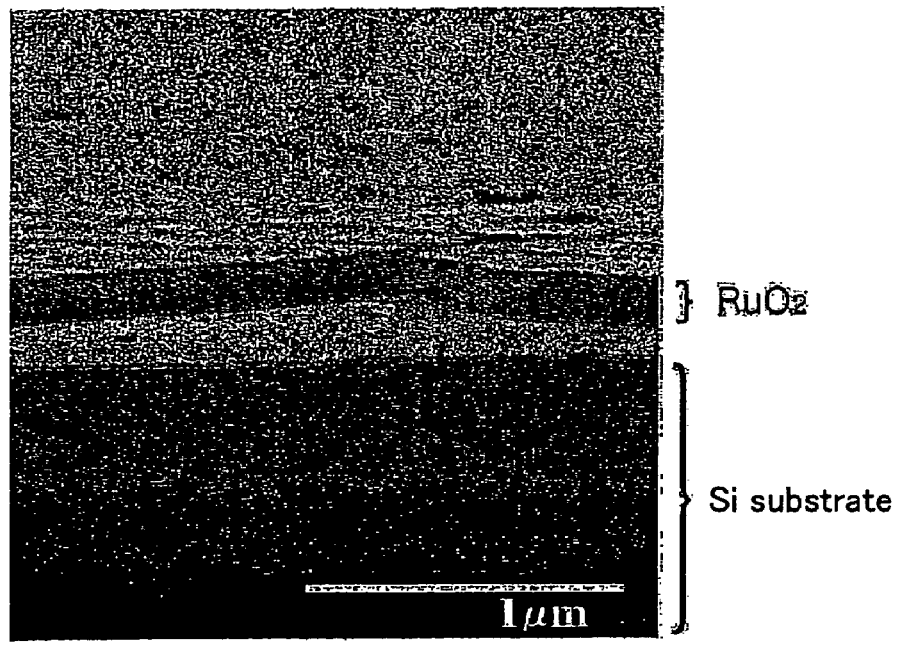
(a)
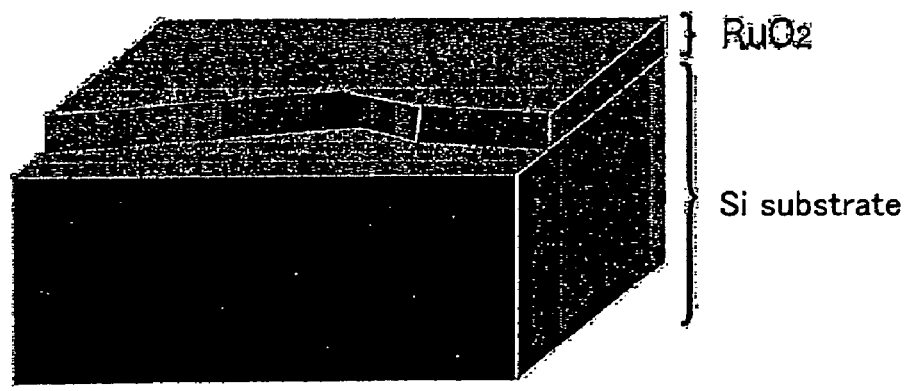
(b)

FIG. 5
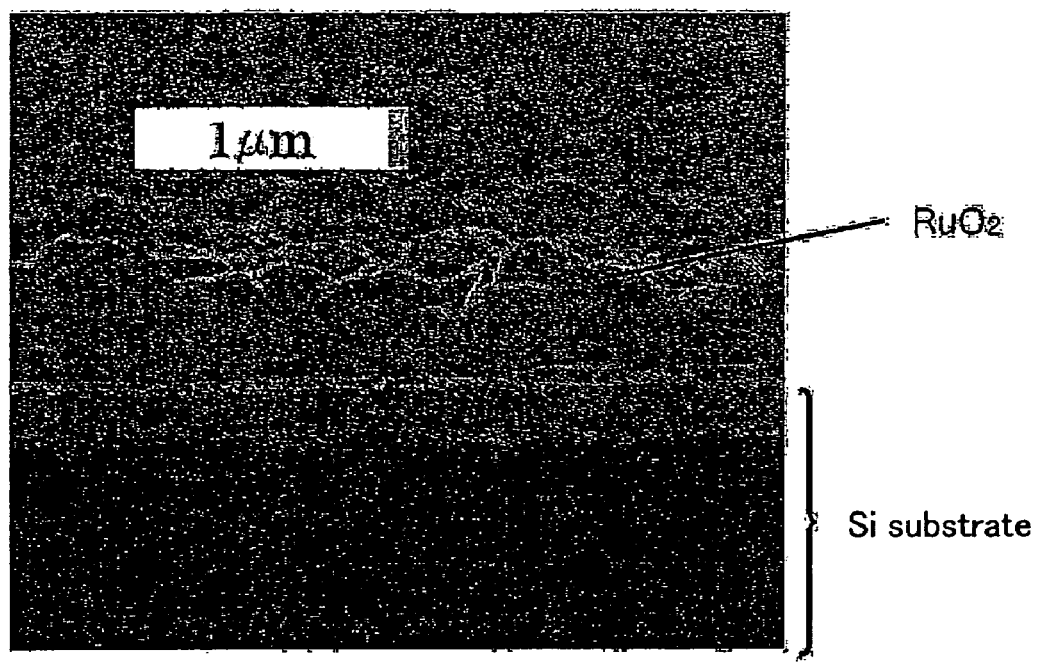
(a)
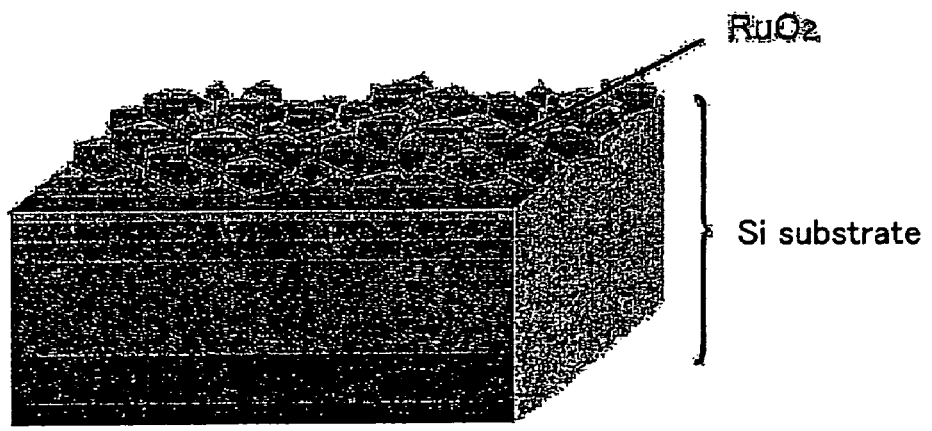
(b)

(a)

(b) } conventional technology etching time (seconds)

DEPOSITION METHOD FOR OXIDE THIN FILM OR STACKED METAL THIN FILMS USING SUPERCRITICAL FLUID OR SUBCRITICAL FLUID, AND DEPOSITION APPARATUS THEREFOR

FIELD OF THE INVENTION

This invention relates to a deposition method for forming an oxide thin film on a substrate by dissolving an oxidant and metal precursors in a supercritical fluid or subcritical fluid, a method for forming stacked metal thin films by reducing the oxide thin film produced by the deposition method, and a deposition apparatus for forming the above-mentioned films.

BACKGROUND OF THE INVENTION

Technologies for material synthesis without using materials having a high environmental burden such as organic solvents have been necessary in recent years. Ultrafine processes such as in integrated circuit manufacturing have been commonly performed using dry processes (vacuum processes) such as in a vacuum, a rarefied gas atmosphere, or a plasma discharge atmosphere.

The dry processes have been developed as highly effective means in terms of the advantage of ability to directly use atoms/molecules or ions in the processes. However, the needs such as for a facility to maintain vacuum and a plasma generator are high-cost factors. On the other hand, wet processes using a liquid such as for plating and cleaning results in producing an enormous amount of wastewater, which may cause an environmental problem.

A supercritical $CO_2$ fluid with has unique properties, such as having an intermediate quality between liquid and solid, having zero surface tension, and having a high ability to dissolve other substances (dissolvability). Furthermore, a supercritical fluid has advantages, such as chemically stable, low price, harmless and low cost. In addition to them, a supercritical fluid has many features, such as that $CO_2$ itself and substances dissolved in $CO_2$ fluid are recyclable by vaporization and reliquefaction.

Research and development using supercritical $CO_2$ have been advanced centering on a wafer cleaning process in integrated circuit manufacturing processes. For example, in a cleaning process, a process focusing on the dissolvability, safety and recyclability of supercritical $CO_2$ has been developed. Also, in supercritical $CO_2$, focusing on the zero surface tension, research and development of ultrafine process for nanoscale wiring have been conducted.

For example, a thin film formation is one of the main functions in the manufacture of semiconductor equipment, and Rapid Expansion of Supercritical Solution is known as a method for thin film formation using a supercritical fluid. D. Matson and the collaborators disclosed a technology for forming a supersaturated material by expanding a supercritical fluid in which source materials dissolve. And a further developed technology has been also disclosed, which is a method for obtaining a metal oxide thin film by dissolving oxide complexes in a supercritical fluid and spraying it on a heated substrate (See patent document 1 and non-patent document 1).

A supercritical fluid penetrates extremely deeply into a nanopore since the surface tension is zero and the diffusion coefficient is large. If a supercritical fluid itself can be used as a reaction medium for thin film formation, it will become possible to form and fill a substance in an ultrafine structure, and further to develop a low-cost green process replacing CVD and plating.

The inventors have developed independently a method for forming a thin film by dissolving thin film forming materials such as an organic metal in supercritical $CO_2$ and then letting a deposition reaction proceed (E. Kondoh and H. Kato, Microelectron. Eng. Volume 64 (2002), Page 495), and have applied the method to the manufacture of integrated circuit wires, such as Cu filling into viaholes and trenches and forming diffusion prevention films (Japanese Patent Application No. 2003-17948 "handotaisochi no seizohoho" (Method of manufacturing semiconductor apparatus), Japanese Patent Application No. 2003-17949 "handotaisochi no seizohoho" (Method of manufacturing semiconductor apparatus)). Also, the same sort of method has been disclosed in Published Japanese translation of PCT application No. 2003-514115.

Patent document 1: Japanese Patent Application Publication No. 2003-213425

Non-patent document 1: J. Mater. Sci. Volume 22, Issue 6, 1918 (1987)

Patent document 2: Japanese Patent Application No. 2003-17949

Patent document 3: Japanese Patent Application Publication No. 2003-514115

DISCLOSURE OF THE INVENTION

Problems to be Solved by the Invention

However, in any of these technologies, there was a problem that a metal thin film was unable to be formed unless a substrate on which a thin film to be formed has electrical conductivity. For this reason, a process was necessary to provide electrical conductivity for a deposited substrate by sputtering or other means for the purpose of forming a metal thin film to an intended place as wiring, which caused problems such as process complexity and high cost.

Therefore, in order to solve such problems, the invention is intended to provide a method for forming an oxide thin film or stacked metal thin films without relying on the property (presence or absence of electrical conductivity) of a deposited substrate, and also to provide a deposition apparatus for such a dense thin film.

Means for Solving the Problems

The invention is to dissolve metal precursors for a metal oxide to be formed and an oxidant to oxidize the metal precursors in a supercritical fluid or subcritical fluid, and to form a thin film of the metal oxide by an oxidation reaction on the surface of a substrate placed in the supercritical fluid or subcritical fluid.

It is preferable for an oxidant to be $O_3$, $N_2O$ or $H_2O$. $O_3$ releases atomic oxygen when decomposing on a substrate surface. Since such atomic oxygen is highly reactive, it reacts on a substrate surface with metal precursors included in a supercritical fluid or subcritical fluid, and forms a metal oxide thin film. It is conceivable to use $O_2$ as an oxidant, but it has been known that a dense metal oxide cannot be formed with $O_2$. Additionally, it is preferable for the substance of the supercritical fluid or subcritical fluid to be $CO_2$.

It is preferred that the oxidation reaction is performed at a temperature equal to or higher than the melting point of the metal precursors and equal to or lower than 400 degree C. of not destroying integrated circuits.

It is preferable for the metal precursor to be a Ru compound. This is because the use of Ru has an effect of preventing diffusion of Cu that is usually used as a material for wiring in the manufacturing process of integrated circuits. It is also preferable for the $O_3$ to be diluted with $CO_2$ because using pure $O_3$ involves a risk of explosion. Further, it is preferred that the medium of the supercritical fluid or subcritical fluid is the same quality as the medium to dilute the oxidant. It is because, if both are the same quality, there is no possibility of causing unnecessary reaction by identifying the other substance as an impurity.

The invention is to dissolve metal precursors for a metal oxide to be formed and an oxidant to oxidize the metal precursors in a supercritical fluid or subcritical fluid; to form a metal oxide thin film by an oxidation reaction on the surface of a substrate placed in the supercritical fluid or subcritical fluid; then, to dissolve a reducing agent and conductive metal precursors in a supercritical fluid or subcritical fluid; while reducing the metal oxide thin film formed on the surface of the substrate to a metal thin film, to reduce the conductive metal precursors on the reduced metal thin film; and to laminate a thin film of conductive metal.

The inventors developed a technology to obtain a metal thin film by dissolving organometallic complexes in a supercritical fluid and causing a reduction reaction by added $H_2$. However, the inventors have confirmed that no thin film was formed but only particles were synthesized unless $H_2$ was added.

It is preferred that a metal oxide is $RuO_2$, the metal thin film is Ru, and the conductive metal is Cu. This is because the use of Ru has an effect of preventing diffusion of Cu that is usually used as a material for wiring of integrated circuits.

It is preferable for the reducing agent to be $H_2$. It is necessary that a heterogeneous reaction proceeds continuously on a substrate surface and a growing surface to form a thin film. It is necessary that a substrate plays a catalytic role to cause a reaction preferentially on the substrate. A substrate metal promotes $H_2$ dissociation in Cu deposition. The inventors have found in the study above that a $H_2$ reduction reaction is selectively caused only on a conductive substrate. This is because a $H_2$ dissociation reaction proceeds preferentially on a metal substrate.

The invention is a deposition apparatus for stacked metal thin films having means for dissolving metal precursors for a metal oxide to be formed and an oxidant other than oxygen to oxidize the metal precursors in a supercritical fluid or subcritical fluid; means for forming a metal oxide thin film by an oxidation reaction on the surface of a substrate placed in the fluid; means for discharging the supercritical fluid or subcritical fluid after completion of forming the metal oxide thin film; means for dissolving conductive metal precursors and a reducing agent in a supercritical fluid or subcritical fluid; and means for, while reducing the metal oxide thin film formed on the surface of the substrate to a metal thin film by a reduction reaction, forming a thin film of conductive metal from the conductive metal precursors on the surface of the metal thin film by a reduction reaction.

The deposition apparatus for stacked metal thin films further has means for controlling the temperature of oxidation reaction and/or reduction reaction. Because it is preferable for reaction temperatures to be controlled depending on the type of metal oxide thin film and the type of conductive metal thin film intended to be formed.

Effects of the Invention

The invention enables to form a metal oxide thin film regardless of the presence or absence of electrical conductivity of a substrate in a supercritical fluid or subcritical fluid. The invention also enables to reduce such a metal oxide thin film to a metal thin film and to laminate a thin film of metal, usually used as a wiring material, on the metal thin film. The invention enables to form a metal oxide thin film and a metal thin film with good step coverage and implant quality by simple processes.

BRIEF DESCRIPTION OF THE DRAWINGS

FIG. 3 is a photograph of cross-section SEM of a thin film obtained on a Si substrate.

FIG. 5 is a SEM photograph of a film in using $O_2$ as an oxidant;

DESCRIPTION OF THE REFERENCE NUMERALS

Figure 1:
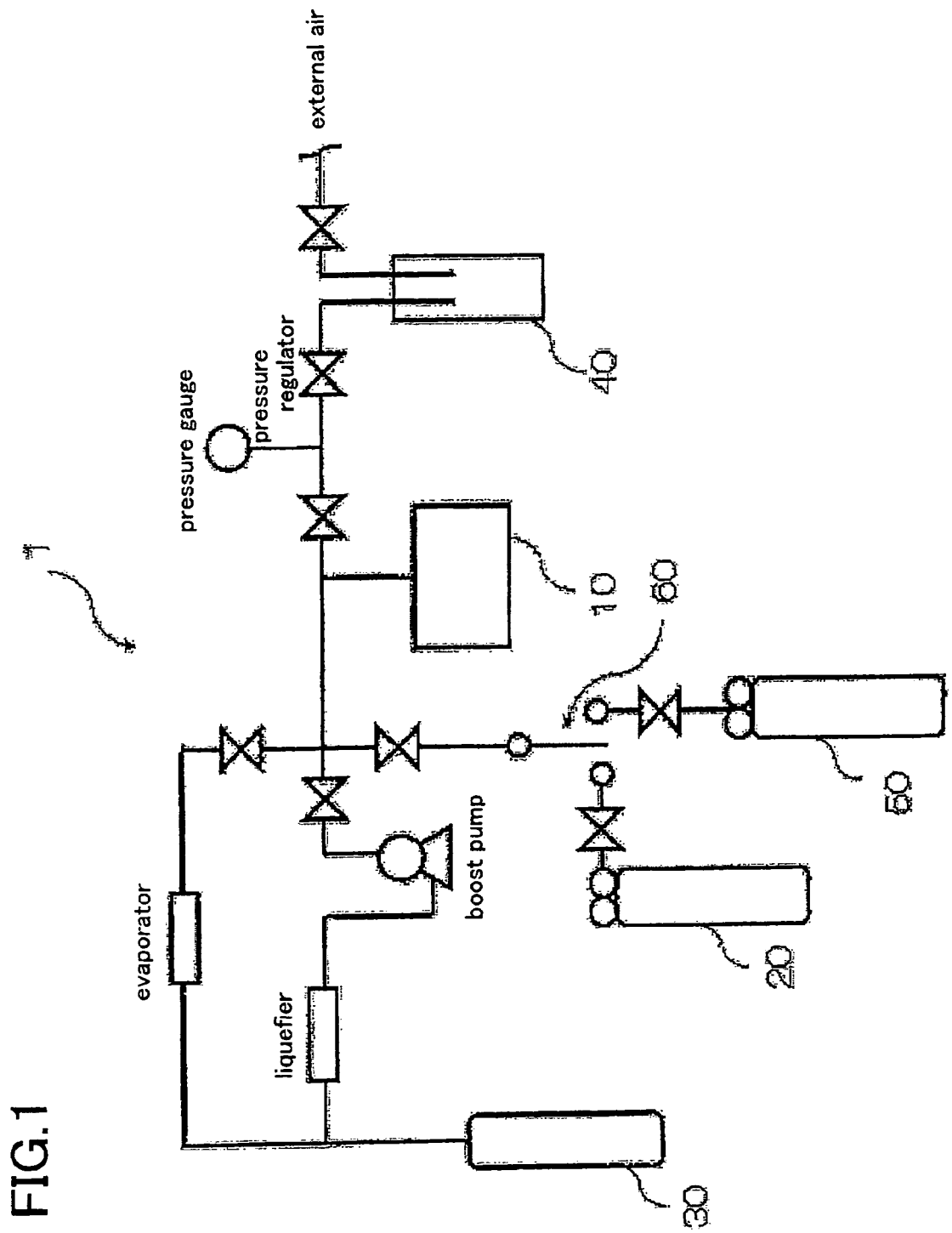
FIG. 1 is a block diagram illustrating a deposition system concerning implementation of the invention.

1: an example of system configuration for implementation of the invention
10: block diagram of a high-pressure reactor
11: substrate
12: substrate support
13: thermocouple
14: magnetic stirrer
15: electrothermal wire (/heater)
16: fluid outlet
17: bolt
18: stirring bar
19: metal precursor
20: $O_3$ supply cylinder
30: $CO_2$ supply cylinder
40: evaporator/separator
50: $H_2$ supply cylinder
60: piping switch In the description, a supercritical fluid means a fluid state neither liquid nor gas, in which the difference between gas and liquid disappears by keeping a gas such as $CO_2$ above the critical point.

In the description, a subcritical fluid means a fluid state just below the critical point.

In the description, a metal precursor is a generic term referring to organometallic compound, organometallic complex, halogenated metal and halogenated complex.

FIG. 1 is an example of a system configuration to implement the invention. $CO_2$ gas as the medium of supercritical fluid or subcritical fluid is liquefied by a liquefier from the $CO_2$ supply cylinder 30, and thereafter pressurized by a boost pump and sent to the high-pressure reactor 10. It is preferable for the pressure of the high-pressure reactor 10 to be kept at the critical point of $CO_2$, 7.4 MPa or above by a pressure regulator and a pressure gauge. The pressure can be slightly lower than 7.4 MPa as being in a subcritical fluid.

Valves and a pressure regulator are installed downstream of the high-pressure reactor 10. After a reaction is completed in the high-pressure reactor 10, a supercritical fluid in the high-pressure reactor is lead into the evaporator/separator 40 by controlling the opening and closing of each valve. The supercritical $CO_2$ fluid is evaporated in the evaporator/separator 40, and along with which the substances dissolved in the fluid are separated and recovered.

A heater and a thermocouple are installed in the high-pressure reactor 10, by which the inside temperature can be controlled while being heated and kept to the predetermined temperature. And, the supply of reaction gas is controlled by a control valve (not shown in the figure) installed close to the gas supply port of the high-pressure reactor 10.

Figure 2:
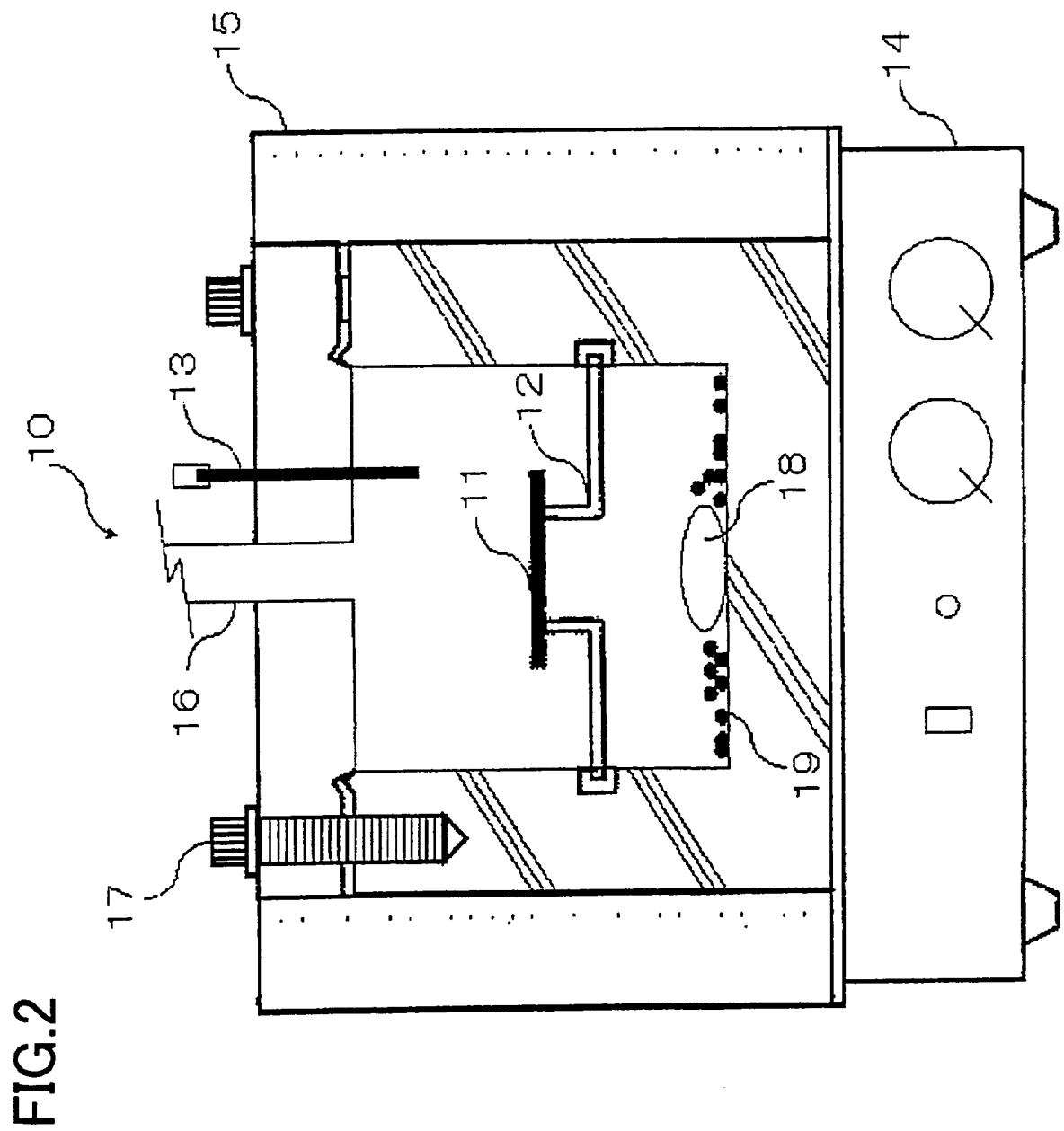
FIG. 2 is a block diagram illustrating a high-pressure reactor concerning implementation of the invention.

FIG. 2 illustrates an example of the configuration of the high-pressure reactor 10. It is preferable for the high-pressure reactor 10 to be a pressure/heat-resistant container made of stainless steel, but not to be limited to it. The high-pressure reactor 10 can be manufactured by, for example, processing an autoclave (pressure deforming device).

A substrate support is installed inside the high-pressure reactor 10, on which a substrate for forming a thin film is installed. A thin film is formed on the surface of a substrate, and it is preferable for the substrate to be installed facing up the surface on which a thin film is formed.

In FIG. 2, a supercritical fluid including $CO_2$ and added gas is supplied from the fluid outlet 16. A supercritical fluid after forming a film is discharged into the evaporator/separator 40 through the outlet pipe. The high-pressure reactor 10 contains the metal precursors 19 for a metal oxide thin film intended to be formed. The metal precursors are agitated with the stirring bar 18 made to rotate by the magnetic stirrer 14, and then dissolved equally in a supercritical fluid.

The reason why the use of a stirring apparatus and the fixation of the substrate 11 by the substrate support 12 is to efficiently provide metal precursors for the substrate 11, but not limited to this configuration as far as the purpose is achieved. Additionally, since a deposition reaction occurs only on the surface of a substrate, it may as well be configured to heat only the substrate instead of the whole of the high-pressure reactor 10.

EXAMPLE 1

In an example of the invention, RuO2 (ruthenium oxide) used widely as a capacitor electrode of dynamic random access memory was deposited as a metal oxide thin film.

A metal precursor for a metal oxide intended to be formed was bis(cyclopentadienyl)ruthenium ($RuCp_2$), an organic ruthenium compound. Bis(cyclopentadienyl)ruthenium weighed in the specified amount was contained in a high-pressure container capable of containing 50 mL with the stirring bar 18 in FIG. 2. After a Si substrate washed with dilute hydrofluoric acid for one minute was installed on the substrate support 12 in the high-pressure reactor 10, the high-pressure reactor was covered with the lid, and bolted with the stainless bolts 17.

Then, while various valves and the piping switch 60 in FIG. 1 were being controlled, O3 gas diluted to 5% with CO2 was provided from the O3 supply cylinder 30 to the high-pressure reactor 10. The pressure at this moment was 0.1 MPa. In this way, the inside the high-pressure reactor 10 was filled with 5% concentration of O3 gas under pressure at 0.1 MPa. It is preferable to form a vacuum inside the high-pressure reactor 10 with a vacuum pump in advance. The high-pressure reactor 10 may as well be filled with 5% concentration of O3 gas under pressure at 0.1 MPa after being filled with CO2 at a much lower pressure than 0.1 MPa by the CO2 supply cylinder 30 instead of forming a vacuum in advance.

And then, while various valves and the piping switch 60 were being controlled, liquid CO2 was provided into the high-pressure reactor 10 by the CO2 supply cylinder 30 so as to increase the pressure of the high-pressure reactor to 10 MPa. While being agitated with the stirring bar 18, the temperature of the whole container was heated up to 250 degree C. by the heater 15, and after being reacted for 3 minutes, each valve was closed to stop heating by the heater 15, and the container was cooled with water.

When the valves downstream of the high-pressure reactor 10 were opened to discharge the fluid in the high-pressure reactor 10 through the evaporator/separator 40, and the lid of the high-pressure reactor 10 was opened to eject the Si substrate, a shiny film was formed on the Si substrate.

FIG. 3 (a) is a photograph of cross-section SEM of a thin film obtained on a Si substrate. The picture shows that the dense and even thin film has been formed approximately 100 nm in thickness. FIG. 3 (b) is a view showing a frame format of the photograph of FIG. 3 (a).

Figure 4:
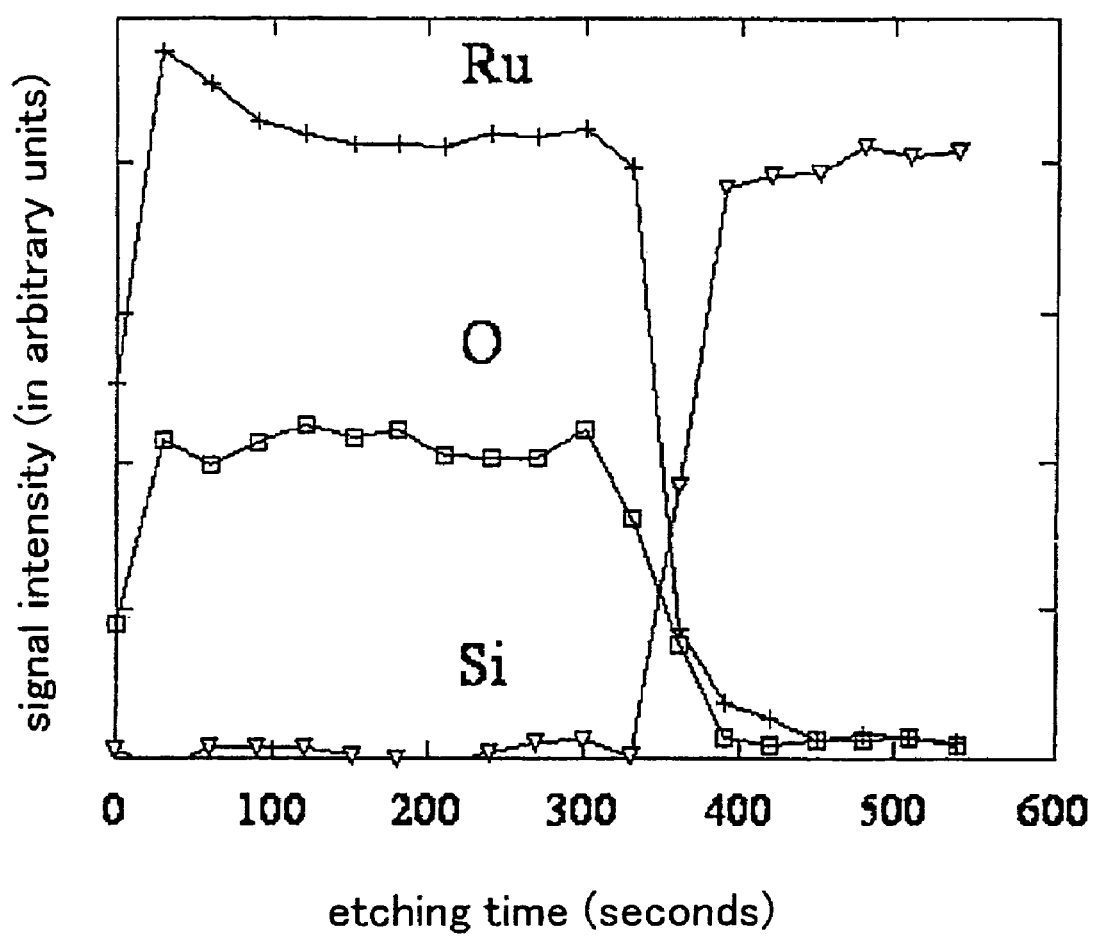
FIG. 4 is a chart showing the result of depth analysis by means of X-ray photoelectron spectroscopy.

FIG. 4 shows the result of depth analysis by means of X-ray photoelectron spectroscopy. In FIG. 4, the horizontal axis represents etching time (seconds), and the vertical axis represents signal intensity. In FIG. 4, each signal intensity of Ru and O remains at approximately the same level up to 350 seconds. On the other hand, the signal intensity of Si remains at approximately 0. When more then 300 seconds have passed, the signal intensity of Si starts increasing while each signal intensity of Ru and O starts decreasing. This indicates that a $RuO_2$ thin film in a constant proportion between Ru and O has been formed on Si.

When the film resistivity was measured by a four-point probe, the resistivity was 200 micro-ohm-cm.

COMPARATIVE EXAMPLE 1

When using $O_2$ instead of $O_3$ gas diluted to 5% with $CO_2$, a $RuO_2$ thin film was not formed on a Si substrate. But when the temperature was heated from 250 to 350 degree C. by the heater 15, particles or a thin film mixed with many particles were/was formed. FIG. 5 (a) is a SEM photograph of the film obtained under such a condition. The film is too brittle to measure its electrical resistivity, and so it is supposed to have no conductivity. FIG. 5 (b) is a view showing a frame format of the photograph of FIG. 5 (a).

It has become clear from the example and the comparative example above that the properties of films to be formed differ greatly in the case of using $O_3$ and the case of using $O_2$. This is because $O_3$ decomposes to $O_2$ on a substrate surface, and at the time, releases atomic oxygen. Since such atomic oxygen is unstable, it is considered that as soon as the atomic oxygen reaches on the surface of a Si substrate, the atomic oxygen reacts with $RuCp_2$ that is a metal precursor in the supercritical fluid in the high-pressure reactor 10, and produces $RuO_2$ compounds on the Si substrate. The reason why a $RuO_2$ thin film is formed only on a Si substrate is considered that the reaction of atomic oxygen and $RuCp_2$ is occurred only on the surface of a Si substrate.

On the other hand, since there is no such effect in the case of using $O_2$ as an oxidant, the reaction of $RuCp_2$ and $O_2$ is occurred homogeneously in a supercritical fluid. As a result, it is considered that particulate matters are deposited on a Si substrate. Additionally, since $O_2$ is stable, it is considered that the reaction of RuCp$_2$ and O$_2$ has not been occurred at a reaction temperature of 250 degree C. and up to 350 degree C.

High concentration ozone such as liquid ozone can be used instead of O$_3$ gas diluted to 5% with CO$_2$. But since high concentration ozone can self-decompose explosively, it is preferred to be diluted to about less than 10% with an appropriate diluent medium. As the diluent medium for O$_3$, an inert gas, or a type of chlorofluorocarbon such as Ar, N$_2$, Xe and CF$_4$ can be used. Using the same medium as for the supercritical fluid in this dilution has the advantages that there is no possibility for both to become an impurity to the other, and also no possibility of an effect on the critical point of the supercritical fluid in the high-pressure reactor.

Although O$_2$ can be incorporated into the diluted O$_3$ gas, since the reaction temperature is high in the case of using O$_2$ as an oxidant as described in the comparative example, if a low temperature is selected for forming a film, an oxide thin film can be formed in using only O$_3$ as the oxidant.

CO$_2$ was used as the medium for the supercritical fluid, in addition to which a type of inert gas such as Ar, N$_2$ and Xe, a type of halogen gas such as CF$_4$, CHF$_3$ and Cl$_4$, and a polar gas such as NH$_3$, CH$_3$OH and H$_2$O can be used. However, when a particularly supercritical fluid medium is not used as a reactant, CO$_2$ is preferable in terms of safety, low environmental load, low cost and dissolvability. Though the reaction pressure was set at 10 MPa, it is enough at the critical point of the medium (7.4 MPa in the case of CO$_2$) or above, and there is no problem even if the medium is in a subcritical state as long as having the ability of dissolving materials (dissolvability). In the case of CO$_2$, it is preferable that the pressure is set at 6 MPa or above to enable the dissolvability to function, for which the pressure needs to be determined experimentally.

Though the reaction temperature was set at 250 degree C., the temperature needs to be determined suitably at the optimum value by experiments. In the present example, it was determined experimentally in the range between the melting point of RuCp$_2$ (approximately 100 degree C.) set as the lower limit and the permissive temperature in an integrated circuit wiring process, 400 degree C. set as the upper limit.

The amounts of RuCp$_2$ and O$_3$ were determined as follows. Firstly, since the container volume was 50 mL and 5% concentration of O$_3$ was sent to the container under pressure at 0.1 MPa at room temperature, the number of mols of O$_3$ was to be 2.0 mMol (milli-mol). If the reaction is considered formally as RuCp$_2$+2O$_3$→RuO$_2$+2O$_2$+2Cp, necessary RuCp$_2$ is 1.0 mMol, that is, 230 mg. Based on the amount, the actual amount was determined experimentally. In the aforementioned example, a good result was obtained with 50 mg.

Although RuCp$_2$ was used as a metal compound, an organic Ru compound or an oxygen-containing Ru complex such as Ru(CpMe)$_2$, Ru(C$_5$HF$_6$O$_2$)$_2$, and Ru(C$_{11}$H$_{19}$O$_2$)$_3$, can be used.

The present invention is not limited to the production of RuCp$_2$ and a specific chemical composition, either. The invention can be used for the production of various high-dielectric/ferroelectric/superconductor oxides, as a metal oxide, such as titanium oxide, zinc oxide, bismuth oxide, copper oxide, tantalum oxide, aluminum oxide, tin oxide, antimony oxide, indium oxide, lithium oxide, Si oxide, Mg oxide, lead oxide, and as a compound oxide composed of them, such as lead zirconate titanate (Pb(Zr, Ti)O$_3$, PZT) and YBa$_2$Cu$_3$O$_7$ (YBCO).

In the production of a compound oxide, the materials of the compound can be premixed. As the materials, halogenated metal, organic metal, metal complex, oxygen-containing organometallic compound/complex, and halogen-containing organometallic compound/complex can be used, for example, in the production of a tantalum oxide, TaBr$_5$, TaCl$_5$, (C$_5$H$_5$)$_2$TaH$_3$, [(CH$_3$)$_2$N]$_5$Ta, Ta (OC$_2$H$_5$)$_5$, Ta (i-OC$_3$H$_7$) 5 and Ta (OCH$_3$)$_5$ can be widely used, and also the most of the known materials for CVD can be used.

EXAMPLE 2

Secondly, a film was formed by laminating conductive metal by use of the conductive metal oxide thin film formed in Example 1.

In the present example, Si was used as a nonconductive material of the substrate on which a thin film was formed. But an organic thin film such as polyimide and polytetrafluoroethylene (PTFE), an oxide thin film such as SiO$_2$ and Al$_2$O$_3$, or a semiconductor such as Si can also be used.

First, a conductive metal oxide, RuO$_2$ film was formed by the process described above. The oxidant used at the time is not limited to O$_3$, but also N$_2$O or H$_2$O can be used. However, it is obvious that a low resistance thin film can be formed at low temperature when O$_3$ is used. The conditions of forming a RuO$_2$ thin film were as described above, but deposition time was shortened this time, and then a 50 nm thin film was obtained.

After a RuO$_2$ thin film was formed, the high-pressure reactor 10 was once opened, and then the high-pressure reactor 10 was filled with 100% concentration of H$_2$ gas under pressure at 0.1 MPa. Using RuO$_2$ oxide as a substrate, a Cu film was formed in 300 nm thickness on RuO$_2$ by a reduction reaction. The process of Cu deposition was basically the same as the process in Example 1, but differed in the following.

The differences were in (1) Cu was chosen as the metal for a conductive metal thin film intended to be formed; And 350 mg of Cu(C$_5$HF$_6$O$_2$)$_2$, halogen-containing organometallic Cu, was used as a Cu precursor; (2) Instead of 5% concentration of diluted O$_3$ gas as an oxidant, 100% concentration of H$_2$ gas was added under pressure at 0.1 MPa; (3) The reaction temperature was set at 230 degree C.; (4) The reaction time was set to be 5 minutes. 100% concentration of H$_2$ gas was supplied by the control of each valve from the H$_2$ gas supply cylinder 50 and the control of the piping switch 60.

As an oxidant, in addition to H$_2$, CH$_3$OH, CH$_3$COOH, HCOOH and B$_2$H$_6$ can be used. The reduction reaction occurred preferentially on a conductive substrate. In other words, a Cu film was formed not on the nonconductive Si substrate but on the substrate added conductivity by RuO$_2$.

Since a conductive oxide, RuO$_2$ used in the present example is easy to be reduced, RuO$_2$ is reduced to an elemental substance of metal by an oxidant used in forming a Cu film. As a result, a multilayer structure of Cu and ruthenium was formed on a Si substrate, instead of a multilayer thin film structure of Cu and ruthenium oxide.

Therefore, in the present example, a multilayer structure of metal thin films was observed, such as a Ru thin film was formed on a Si substrate, on which a Cu thin film was formed.

Usually, in the case of forming a Cu wiring in the process of manufacturing integrated circuits, a Ru thin film is formed by sputtering, on which a Cu thin film is formed. It is because a Ru metal layer is required for preventing Cu diffusion as a diffusion prevention film. Additionally, since Ru has far superior electrical conductivity than RuO$_2$, it is preferred that a substrate is Ru having good conductivity so that much better wiring can be formed in the case of forming a Cu thin film wiring.

Figure 6:
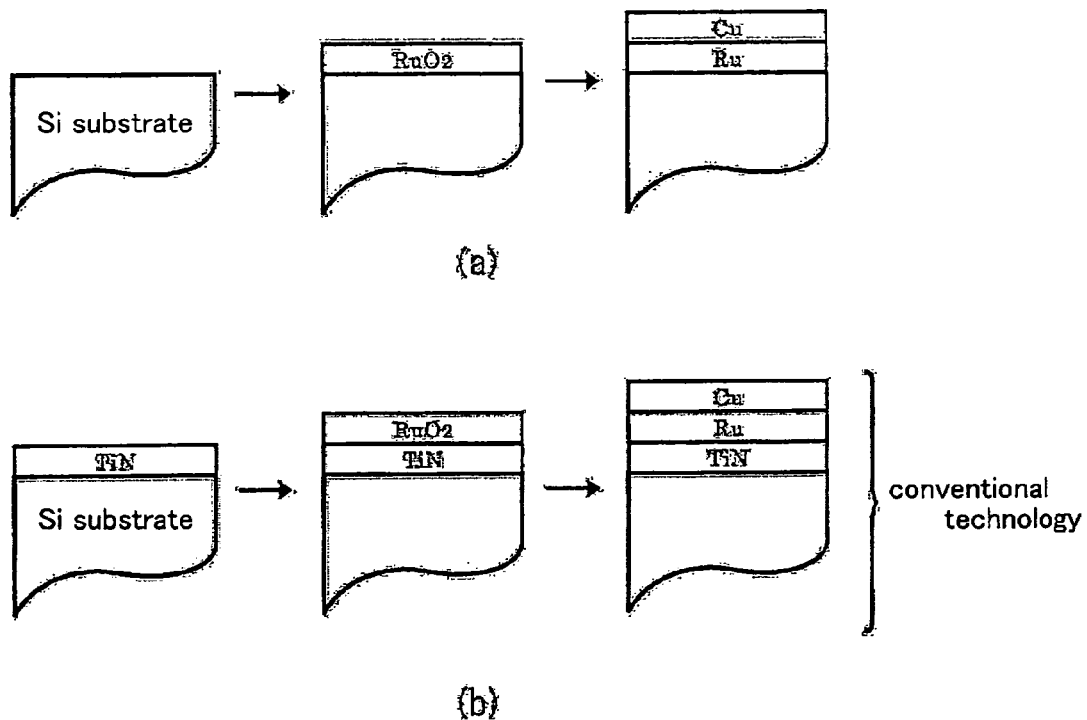
FIG. 6 is a diagram illustrating the process of forming a multilayer metal structure.

In the present example, a Cu film in 300 nm thickness and a Ru laminated structure in 50 nm thickness were able to be obtained by the same apparatus. FIG. 6 (*a*) illustrates the process of forming a multilayer metal structure of Ru and Cu on a Si substrate as shown in the present example. $RuO_2$ is formed on a Si substrate by the process of Example 1 and thereafter, while $RuO_2$ is reduced by $H_2$, $Cu(C_5HF_6O_2)_2$ is reduced and a Cu thin film is formed by the process of Example 2.

Figure 7:
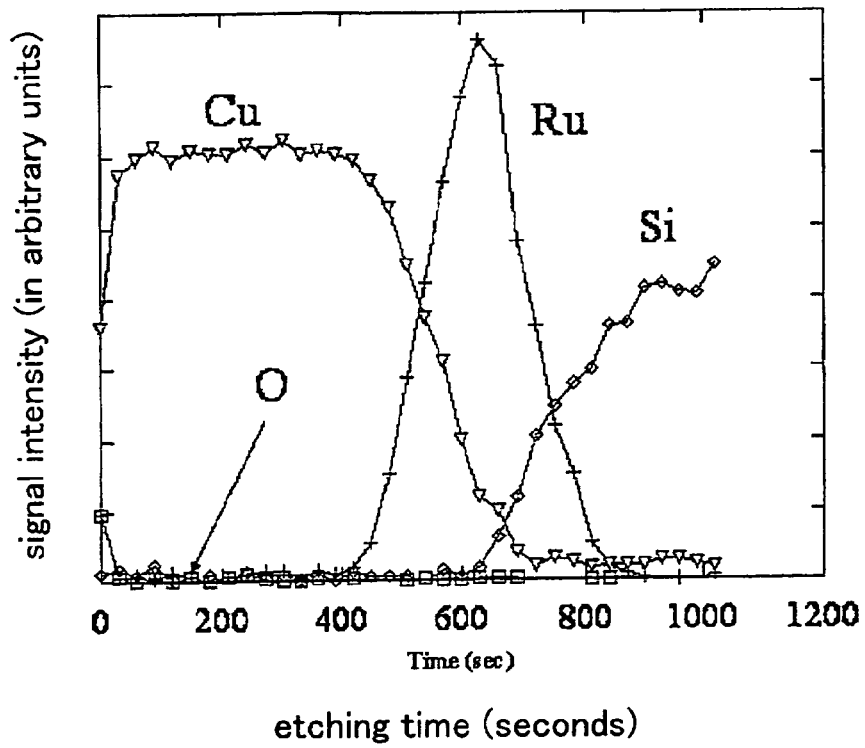
FIG. 7 shows the result of depth analysis of a multilayer metal structure by means of X-ray photoelectron spectroscopy.

FIG. 7 is the result of depth analysis of a multilayer metal structure obtained in the present example by means of X-ray photoelectron spectroscopy. It shows that Cu, Ru and Si are laminated sequentially. Also, since Cu, Ru and Si are different from one to another in etching speed, the length of etching time does not directly correspond to the thickness of a film.

As a conductive substrate, tin oxide, antimony oxide, titanium oxide, indium oxide, copper oxide, lithium oxide and a compound oxide including them, or a type of dope oxide such as Li doped nickel oxide can be used. And as a metal to be deposited, besides a transition metal such as Ru, Cu, Ni, Co, Cr, Min, Nb and Ti, Al can be used.

As materials necessary for the deposition of such metals, halogenated metals, organic metals, metal complexes, oxygen-containing organometallic compounds/complexes, halogen-containing organometallic compounds/complexes can be used, for example, in the case of Cu, materials as known to those skilled in the art, such as $(C_5H_5)CuP(C_2H_5)_3$, $CuCl_2$ $(C_5H_5F_6O_2)CuC_8H_{12}$ and Cu(hfac)TMVS can be used.

FIG. 6 (b) illustrates the way of forming a metal Ru on a conductive TiN thin film and forming a Cu thin film on the Ru thin film, using TiN instead of a Si substrate under the same condition. A metal Ru on a TiN thin film, on which a Cu thin film were able to be formed. However, a metal Ru thin film was not able to be formed directly on a Si substrate.

As described above, a conductive thin film such as Cu and Ru has not been able to be formed directly on a Si substrate in a supercritical fluid or subcritical fluid so far, however, as shown in the present example, a metal oxide thin film such as $RuO_2$ is once formed, and by means of which is reduced, a conductive metal thin film has become possible to be formed. This enables to eliminate the conventional necessity of preforming another conductive layer on a substrate to be wired using PVD or CVD, and to take advantage of the features of a supercritical deposition method.

INDUSTRIAL APPLICABILITY

Regardless of the conductivity of a substrate in a supercritical fluid or subcritical fluid, a conductive metal oxide thin film and a conductive metal thin film can be formed, for which a thin film having good step coverage and implant quality can be formed, and therefore, which can be used for integrated circuit processes, and microfabrication processes such as for MEMS.

The invention claimed is:

1. A deposition method for stacked metal thin films comprising:
dissolving in a supercritical fluid or a subcritical fluid metal precursors for a metal oxide to be formed and an oxidant other than oxygen to oxidize the metal precursors;
forming a metal oxide thin film by an oxidation reaction on a surface of a substrate provided in the supercritical fluid or the subcritical fluid;
then, dissolving a reducing agent and conductive metal precursors in a supercritical fluid or a subcritical fluid;
reducing the metal oxide thin film formed on the surface of the substrate to a metal thin film; and
reducing the conductive metal precursors to form a conductive metal thin film on the metal thin film.

2. The deposition method of claim 1, wherein the metal oxide is $RuO_2$, the metal thin film is Ru and the conductive metal thin film is Cu.

3. The deposition method of claim 1, wherein the reducing agent is $H_2$.

4. A deposition apparatus for stacked metal thin films comprising:
a system for dissolving in a supercritical fluid or a subcritical fluid metal precursors for a metal oxide to be formed and an oxidant to oxidize the metal precursors;
a system for forming a metal oxide thin film by an oxidation reaction on a surface of a substrate provided in the supercritical fluid or the subcritical fluid;
a system for discharging the supercritical fluid or subcritical fluid after completion of forming the metal oxide thin film;
a system for dissolving conductive metal precursors and a reducing agent in a supercritical fluid or a subcritical fluid; and
a system for reducing the metal oxide thin film formed on the surface of the substrate to a metal thin film by a reduction reaction while reducing the conductive metal precursors by the reduction reaction to form a conductive metal thin film on a surface of the metal thin film.

5. The deposition apparatus of claim 4, further comprising a system for controlling a temperature of the oxidation reaction and/or the reduction reaction.

6. The deposition method of claim 1, wherein the oxidant is $O_3$, $N_2O$ or $H_2O$.

7. The deposition method of claim 1, wherein a substance of the supercritical fluid or the subcritical fluid is $CO_2$.

8. The deposition method of claim 1, wherein the oxidation reaction is performed at a temperature equal to or higher than a melting point of the metal precursors and equal to or lower than 400° C.

9. The deposition method of claim 1, wherein the oxidant is $O_3$ which is diluted by $CO_2$.

10. The deposition method of claim 1, wherein the metal precursors are dissolved equally in the supercritical fluid or the subcritical fluid.

11. The deposition method of claim 1, wherein the substrate is heated during the forming step.

12. The deposition method of claim 1, wherein the metal oxide is $RuO_2$, the metal thin film is Ru and the substrate is Si.

13. The deposition method of claim 1, wherein the substrate is nonconductive.

14. The deposition method of claim 1, wherein the metal oxide thin film is reduced to an elemental substance of metal by the reducing agent which is also used in forming the conductive metal film.

15. The deposition apparatus of claim 4, wherein the oxidant is $O_3$, $N_2O$ or $H_2O$.

16. The deposition apparatus of claim 4, wherein a substance of the supercritical fluid or the subcritical fluid is $CO_2$.

17. The deposition apparatus of claim 4, wherein the apparatus performs the oxidation reaction at a temperature equal to or higher than a melting point of the metal precursors and equal to or lower than 400° C.

18. The deposition apparatus of claim 4, wherein the oxidant is $O_3$ which is diluted by $CO_2$.

19. The deposition apparatus of claim 4, wherein the metal precursors are dissolved equally in the supercritical fluid or the subcritical fluid.

20. The deposition apparatus of claim 4, wherein the system for forming a metal oxide thin film heats the substrate during the forming step.

21. The deposition apparatus of claim 4, wherein the metal oxide is $RuO_2$, the metal thin film is Ru and the substrate is Si.

22. The deposition apparatus of claim 4, wherein the substrate is nonconductive.

23. The deposition apparatus of claim 4, wherein the metal oxide thin film is reduced to an elemental substance of metal by the reducing agent which is also used for forming the conductive metal film.

* * * * *